(12) United States Patent
Yamaguchi

(10) Patent No.: US 7,081,374 B2
(45) Date of Patent: Jul. 25, 2006

(54) METHOD OF MANUFACTURING SEMICONDUCTOR DEVICE AND SEMICONDUCTOR DEVICE MANUFACTURING APPARATUS USED IN IT

(75) Inventor: Yoshihiko Yamaguchi, Iide (JP)

(73) Assignees: Renesas Technology Corp., Tokyo (JP); Renesas Northern Japan Semiconductor, Inc., Chitose (JP)

( * ) Notice: Subject to any disclaimer, the term of this patent is extended or adjusted under 35 U.S.C. 154(b) by 0 days.

(21) Appl. No.: 10/878,464

(22) Filed: Jun. 29, 2004

(65) Prior Publication Data

US 2005/0009237 A1    Jan. 13, 2005

(30) Foreign Application Priority Data

Jul. 10, 2003   (JP) .............................. 2003-194955

(51) Int. Cl.
  *H01L 21/44* (2006.01)
  *H01L 21/48* (2006.01)
  *H01L 21/50* (2006.01)
(52) U.S. Cl. ..................................... 438/113; 438/114
(58) Field of Classification Search ................ 438/113, 438/114
  See application file for complete search history.

(56) References Cited

U.S. PATENT DOCUMENTS

| | | | |
|---|---|---|---|
| 6,596,561 B1 * | 7/2003 | Takahashi et al. .......... | 438/113 |
| 6,727,723 B1 * | 4/2004 | Shimizu et al. ............. | 324/765 |
| 6,737,292 B1 * | 5/2004 | Seo ............................. | 438/64 |
| 6,764,882 B1 * | 7/2004 | Bolken ........................ | 438/127 |
| 6,777,265 B1 * | 8/2004 | Islam et al. ................. | 438/111 |
| 7,001,797 B1 * | 2/2006 | Hashimoto .................. | 438/113 |
| 2003/0224540 A1 * | 12/2003 | Watanabe et al. .............. | 438/7 |
| 2004/0038510 A1 * | 2/2004 | Munakata et al. .......... | 438/613 |

FOREIGN PATENT DOCUMENTS

| JP | 11-274357 | 10/1999 |
|---|---|---|
| JP | 2002-246336 | 8/2002 |

OTHER PUBLICATIONS

Japan (Publication No. 11-274357), translation "Method and device for dividing electronics component", Oya Yoichi (Aug. 10, 1999).*

* cited by examiner

*Primary Examiner*—W. David Coleman
*Assistant Examiner*—Khiem Nguyen
(74) *Attorney, Agent, or Firm*—Antonelli, Terry, Stout and Kraus, LLP.

(57) ABSTRACT

A semiconductor device manufacturing apparatus includes a pre-alignment section having a pre-alignment camera which is adapted to recognize marks formed on a multi-arrayed substrate, a dicing section which dices the substrate with a cutting blade in accordance with information resulting from image recognition of the marks by the pre-alignment section, and an xy table which carries the substrate. The pre-alignment section recognizes in advance all marks on the substrate based on image recognition thereby to determine the dicing positions, and the dicing section merely recognizes a few points of the substrate with an alignment camera. Consequently, pre-alignment and dicing can take place concurrently, and the throughput of the dicing process can be improved.

17 Claims, 16 Drawing Sheets

COORDINATE DATA TRANSFER

METHOD OF MANUFACTURING SEMICONDUCTOR DEVICE AND SEMICONDUCTOR DEVICE MANUFACTURING APPARATUS USED IN IT

CROSS-REFERENCE TO RELATED APPLICATION

The present application claims priority from Japanese patent application JP 2003-194955, filed on Jul. 10, 2003, the content of which is hereby incorporated by reference into this application.

BACKGROUND OF THE INVENTION

The present invention relates to semiconductor device manufacturing technology, and, more particularly, to a technique which is useful for providing an improvement in the throughput of the dicing process after the block molding process in the manufacture of a semiconductor device.

A conventional dicing scheme is based on the formation of reference division marks on a substrate, with multiple electronic parts being integrated thereon, at the same time and in the same manner as the formation of a wiring line pattern, after which dicing of the substrate into individual electronic devices is carried out in accordance with the reference marks, as shown in Japanese Patent Application Laid-Open No. Hei 11(1999)-274357 (FIG. 4).

Conventional electronic devices formed of multiple electronic parts on a mother substrate without the formation of resin have marks to be used for dicing, as shown in Japanese Patent Application Laid-Open No. 2002-246336 (FIG. 2).

SUMMARY OF THE INVENTION

The inventors of the present invention have studied the fabrication of semiconductor devices in connection with the use of a multi-arrayed substrate which is diced into individual devices after resin-sealing, and they have found the following problems.

At the time of substrate dicing, which is preceded by resin-sealing, it is necessary to recognize automatically the alignment marks which indicate the dicing positions. Due to use of the same stage for mark recognition and dicing, these operations cannot take place concurrently, resulting in a retarded productivity.

On the other hand, reducing the number of automatic recognition points with the intention of speeding up the mark recognition results in a degraded positioning accuracy in the dicing process. In the case of a multi-arrayed substrate based on a multi-layer substrate construction, since there are significant disparities in the width and position of internal wiring lines, a degraded positioning accuracy during dicing will result possibly in a short-circuit between lines.

Particularly, increased wiring layers for dealing with increased signal pins is liable to lead to a short-circuit between lines. Therefore, it is inevitable that degradation of the processing accuracy will occur as a result of the reduction of the number of automatic recognition points.

In many cases, wiring lines are plated by electrolytic plating, which is relatively low in cost, and this plating process necessitates the provision of power feed wiring on each wiring layer. The power feed wiring lines must be cut surely at the time of dicing after resin-sealing. Increased wiring layers for dealing with increased signal pins and the like will increase the positional error of power feed wiring among the layers, resulting in an increased possibility of a short-circuit occurring between wiring layers.

It is an object of the present invention to provide a semiconductor device manufacturing method that is capable of improved throughput of a dicing process.

Another object of the present invention is to provide a semiconductor device manufacturing method that is capable of improved accuracy in the dicing of a semiconductor substrate.

These and other objects and novel features of the present invention will become apparent from the following description and the attached drawings.

Among the aspects and features of the present invention disclosed in this specification, representative examples are briefly described as follows.

The present invention resides in a semiconductor device manufacturing method comprising the steps of: preparing a plurality of multi-arrayed substrates, mounting a plurality of semiconductor chips on the multi-arrayed substrates, resin-sealing the semiconductor chips on the multi-arrayed substrates, and implementing image recognition for a first multi-arrayed substrate of the multi-arrayed substrates which have undergone resin-sealing, and thereafter dicing the first multi-arrayed substrate and, at the same time, implementing the image recognition for a second multi-arrayed substrate.

The present invention resides in a semiconductor device manufacturing method which uses a first processing section having imaging means which is adapted to recognize marks formed on a multi-arrayed substrate which has a plurality of semiconductor device formation areas, a second processing section for dicing the multi-arrayed substrate with a cutting blade in accordance with information resulting from image recognition by the first processing section, and conveyance means for carrying the multi-arrayed substrate between the first and second processing means, the method being capable of implementing concurrently the dicing of a first multi-arrayed substrate in the second processing section and image recognition for a second multi-arrayed substrate in the first processing section.

DESCRIPTION OF THE PREFERRED EMBODIMENTS

In the following description of the embodiments, identical or similar portions will not be explained repeatedly unless it is deemed necessary.

Although the invention will be explained with reference to divided portions or embodiments expediently or when necessary, it is to be understood that these divisions are related each other, i.e., one represents a variant, detailed explanation or supplementary explanation of the other, unless otherwise stated clearly.

In the following explanation of the embodiments, the stated numbers of elements, numeric values, quantities, and ranges are not decisive, but they can be larger or smaller, unless otherwise stated clearly or obvious in principle.

Embodiments of this invention will be explained in detail with reference to the drawings. Throughout the figures, items having the same functions are identified by common symbols, and an explanation thereof is not repeated.

Embodiment 1

Figure 1:
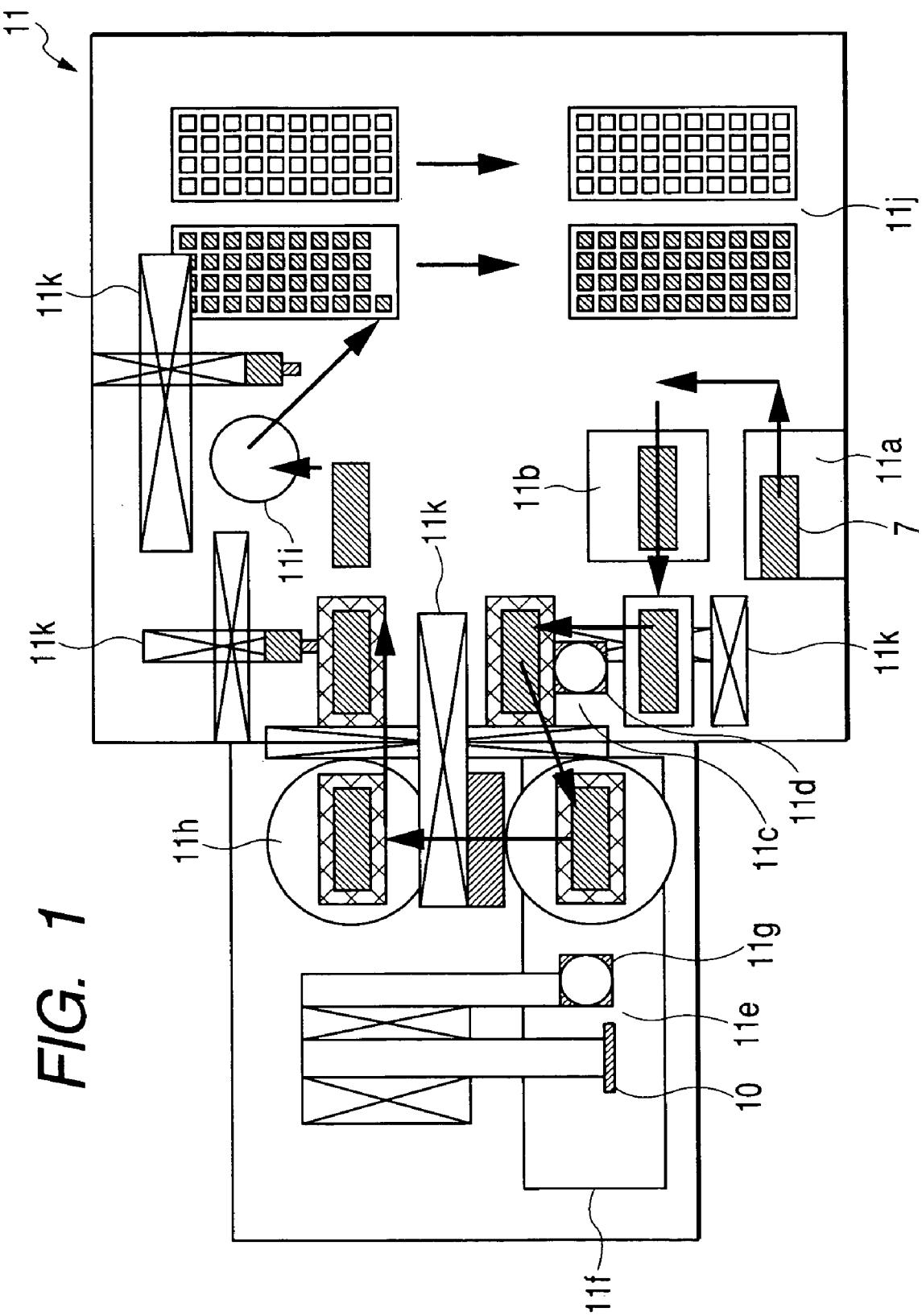
FIG. 1 is a plan view showing the structure of a semiconductor device manufacturing apparatus (combined apparatus) which carries out the semiconductor device manufacturing method based on a first embodiment of this invention.
Figure 2:
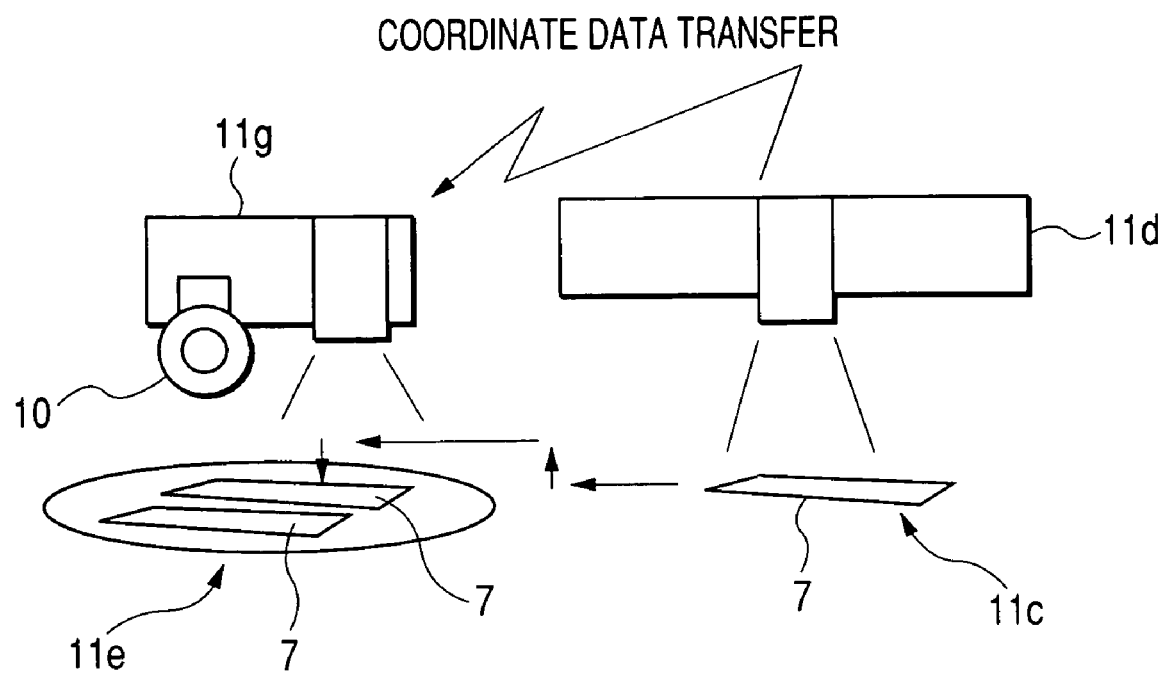
FIG. 2 is a partial front view showing the structure of the principal portions of the semiconductor device manufacturing apparatus shown in FIG. 1.
Figure 3:
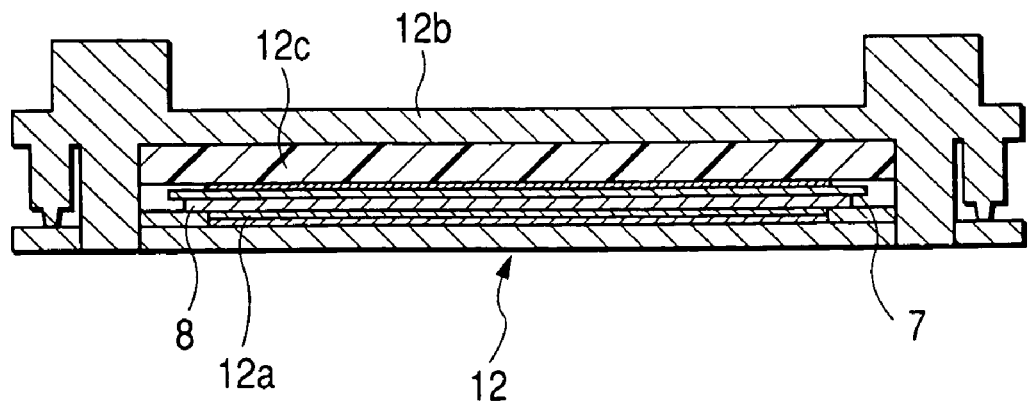
FIG. 3 is a cross-sectional diagram showing the structure of the treatment tool which is used by the semiconductor device manufacturing apparatus shown in FIG. 1.
Figure 4:
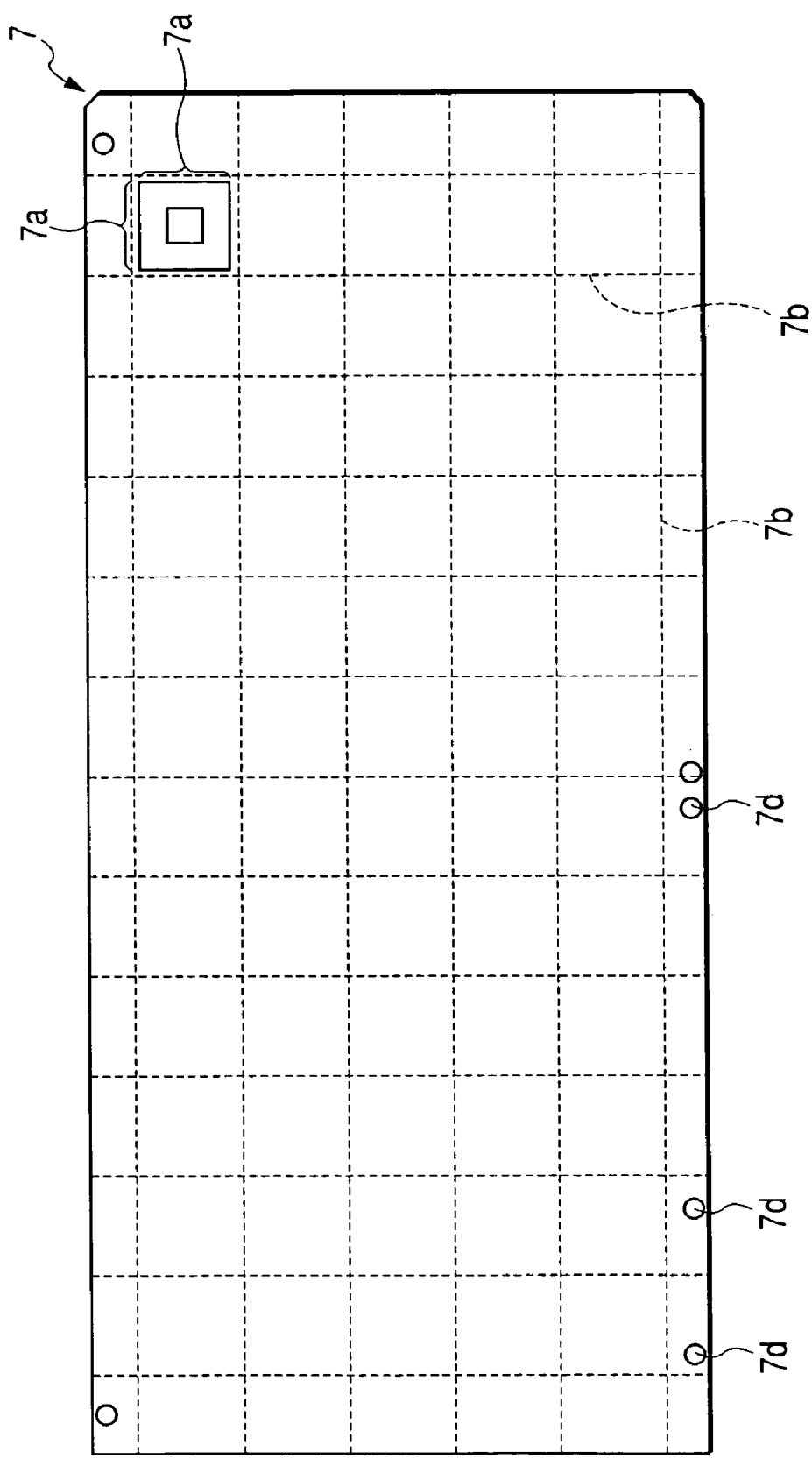
FIG. 4 is a plan view showing the structure of the chip mounting surface of a multi-arrayed substrate used by the semiconductor device manufacturing method of the first embodiment.
Figure 5:
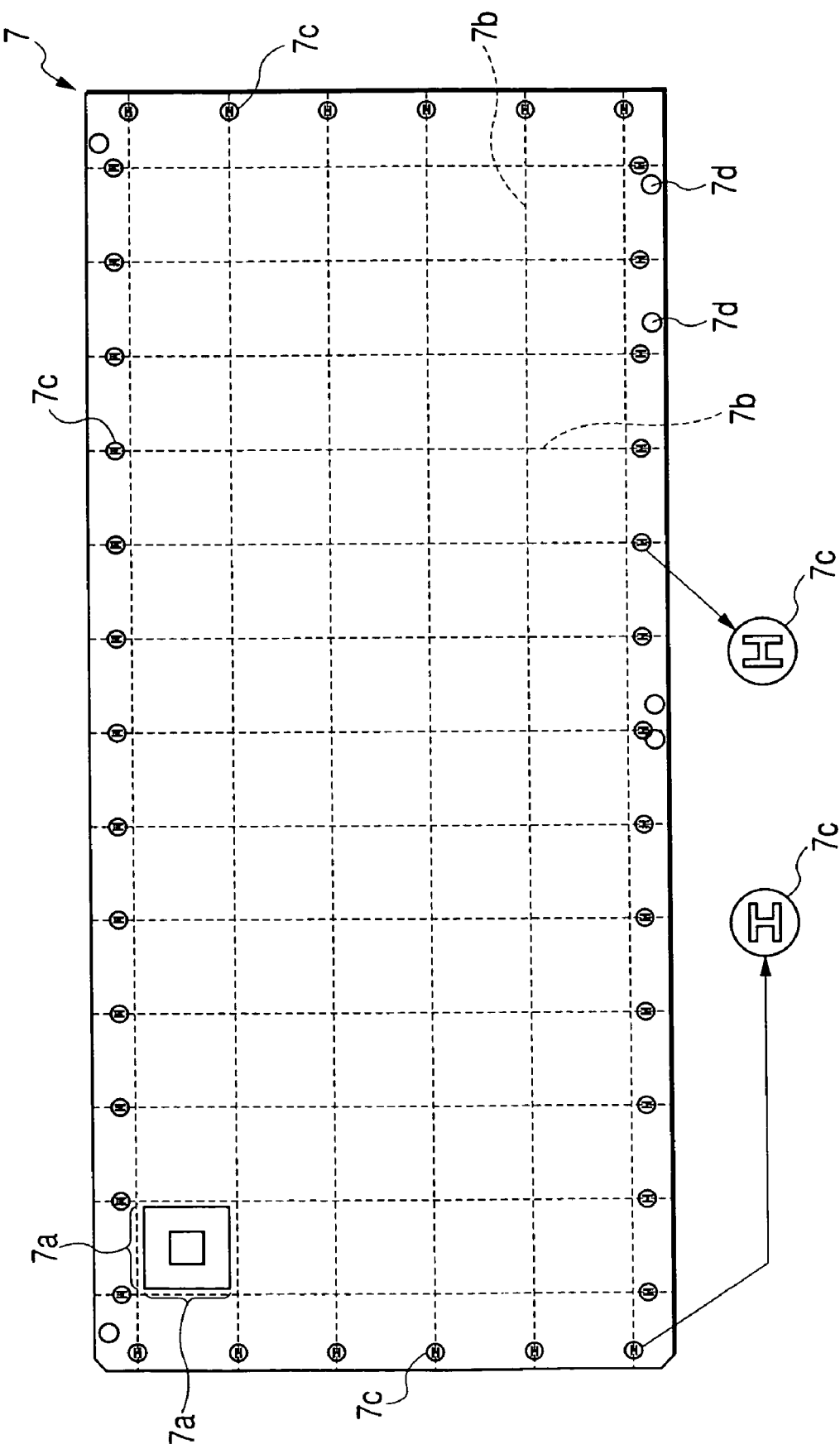
FIG. 5 is a plan view showing the structure of the packaging surface of the multi-arrayed substrate shown in FIG. 4.
Figure 6:
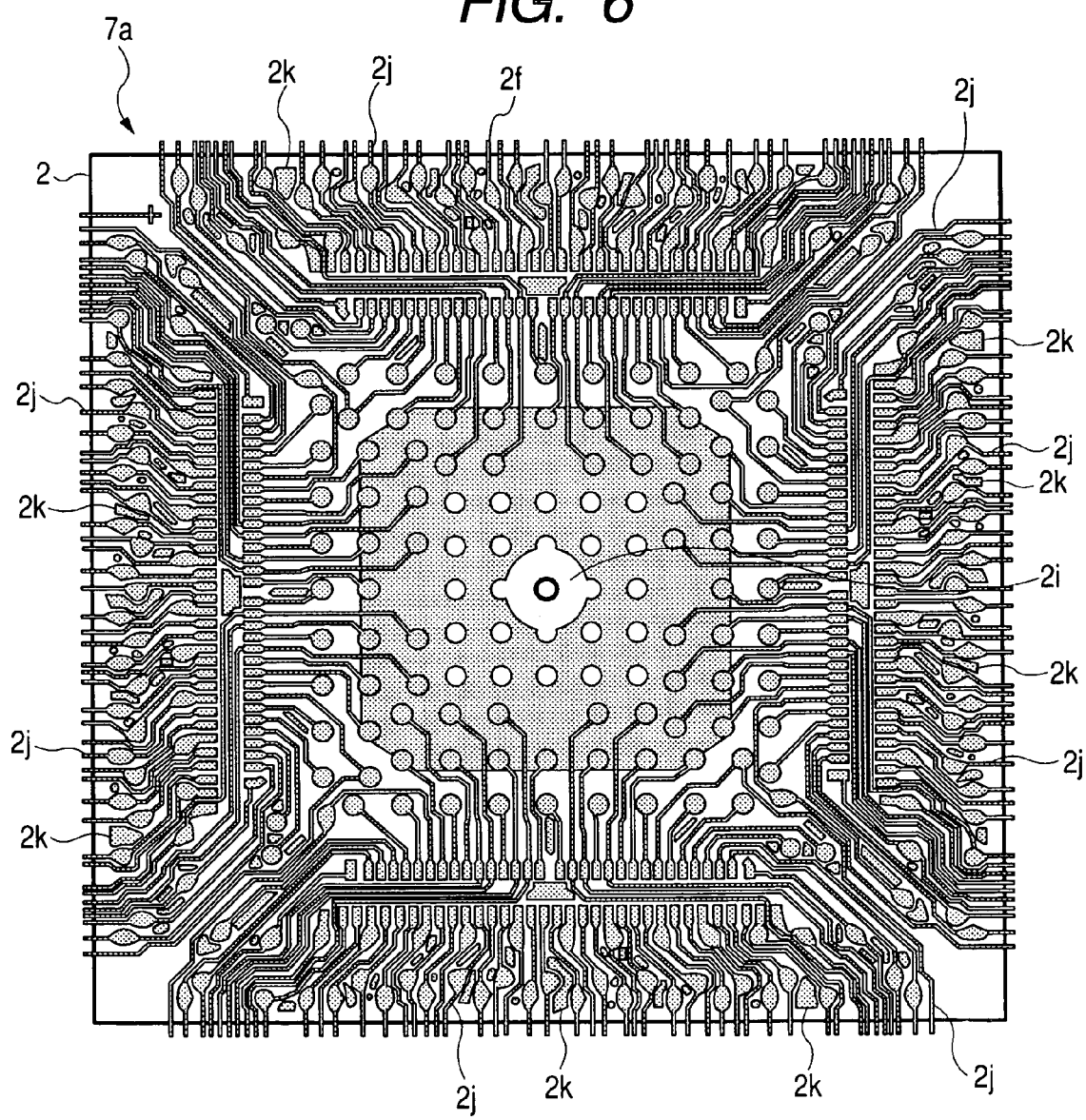
FIG. 6 is an enlarged plan view of a conductor pattern in a device area of the chip mounting surface of the substrate shown in FIG. 4.
Figure 7:
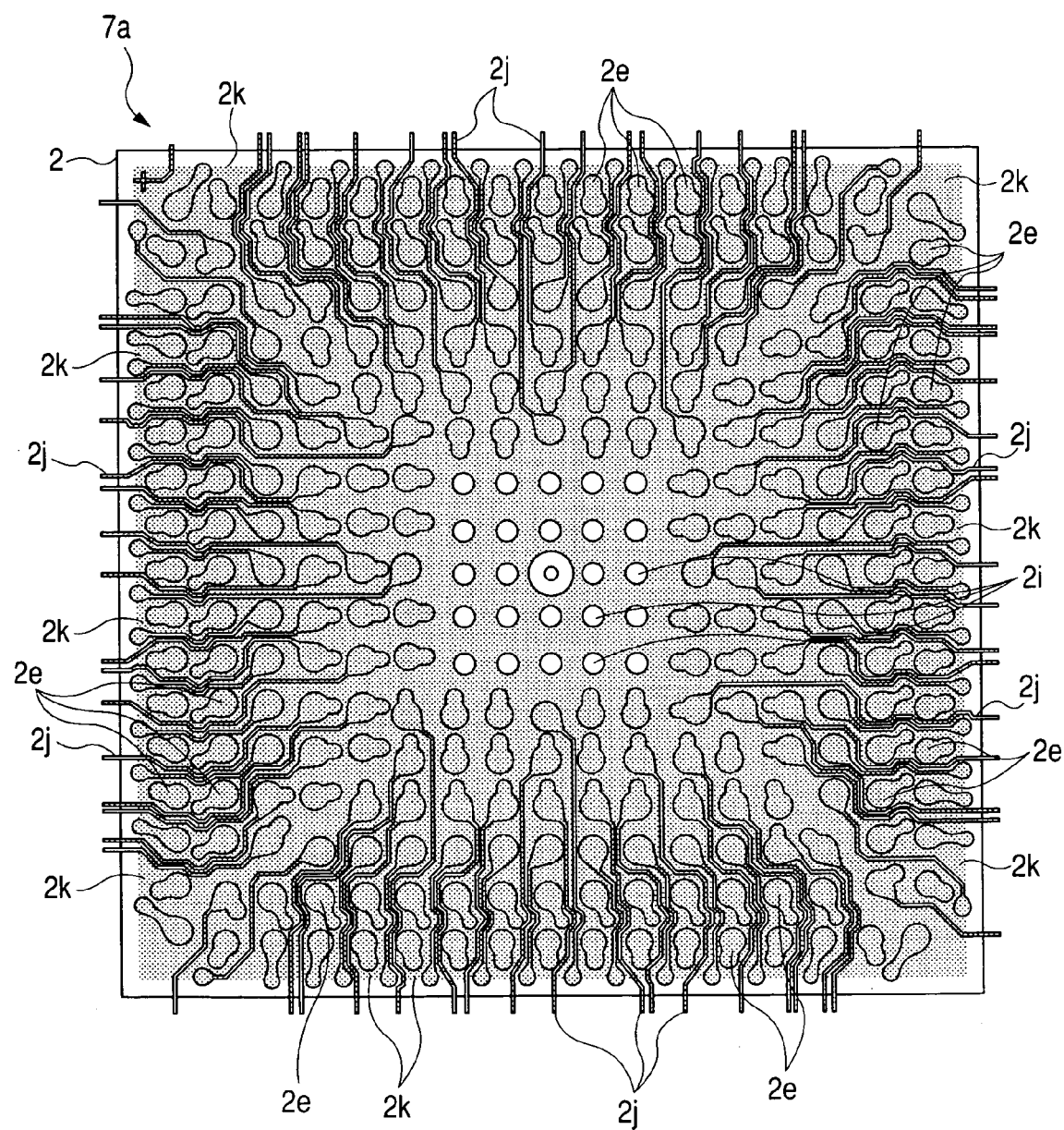
FIG. 7 is an enlarged plan view of a conductor pattern in a device area of the packaging surface of the substrate shown in FIG. 5.
Figure 8:
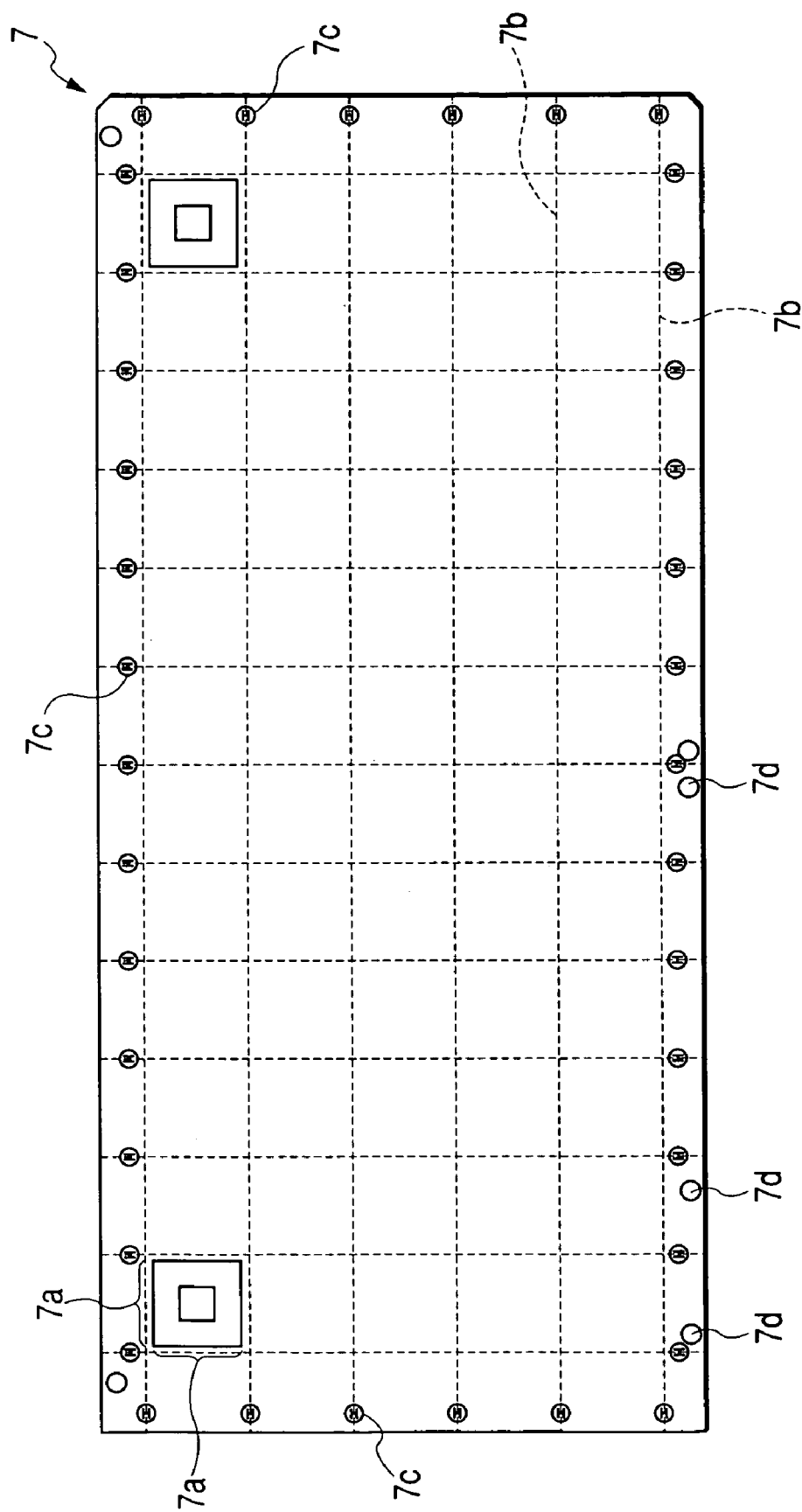
FIG. 8 is a plan view showing the structure of the chip mounting surface of a multi-arrayed substrate based on a variant of the first embodiment.
Figure 9:
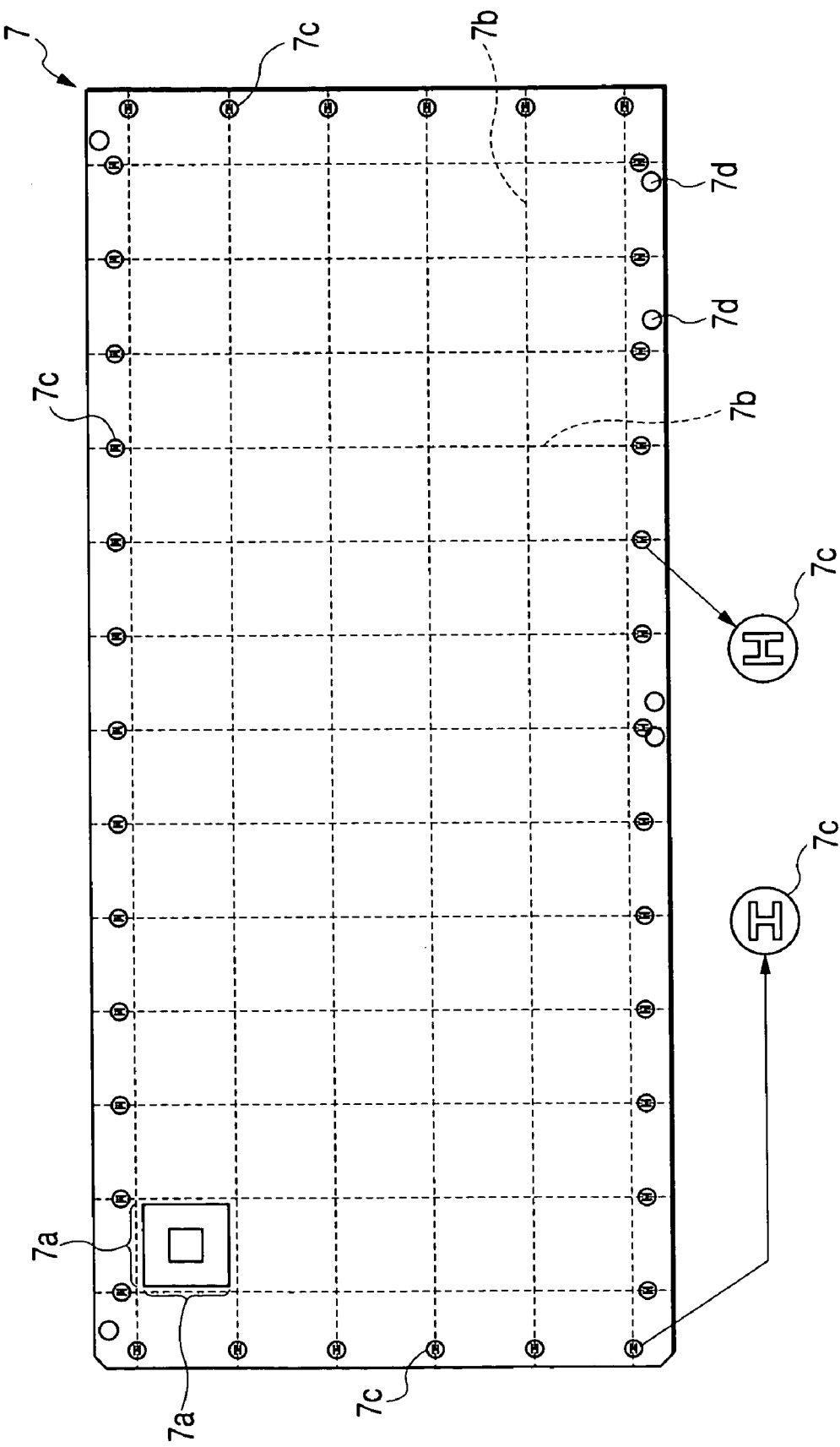
FIG. 9 is a plan view showing the structure of the packaging surface of the multi-arrayed substrate shown in FIG. 8.
Figure 10:
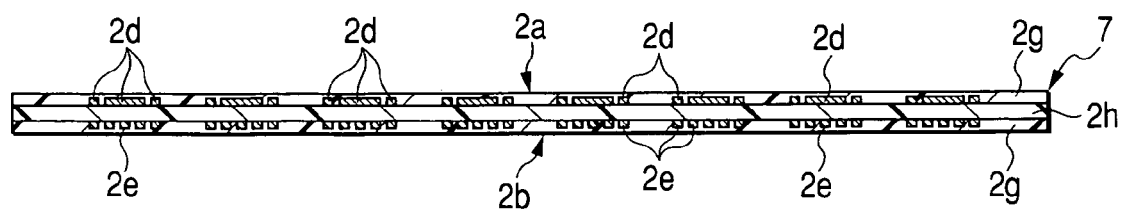
FIG. 10 is a cross-sectional diagram showing the substrate structure at the commencement of fabrication of semiconductor devices based on the first embodiment of this invention.
Figure 11:
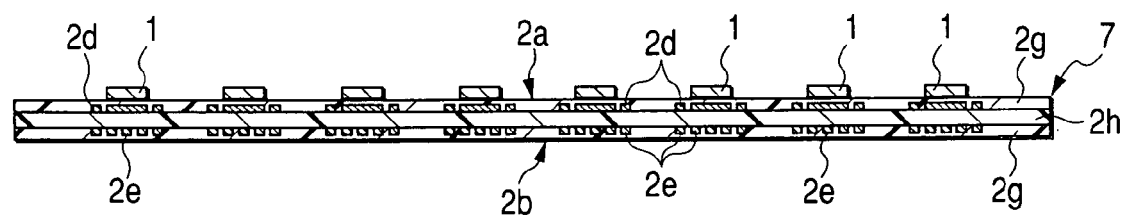
FIG. 11 is a cross-sectional diagram showing the substrate structure at die bonding during the fabrication of semiconductor devices based on this embodiment.
Figure 12:
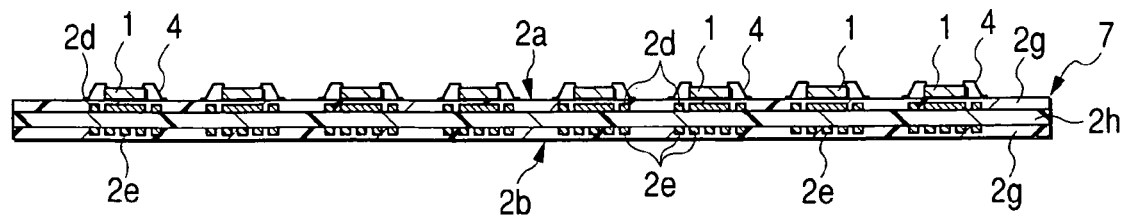
FIG. 12 is a cross-sectional diagram showing the substrate structure at wire bonding during the fabrication of semiconductor devices based on this embodiment.
Figure 13:
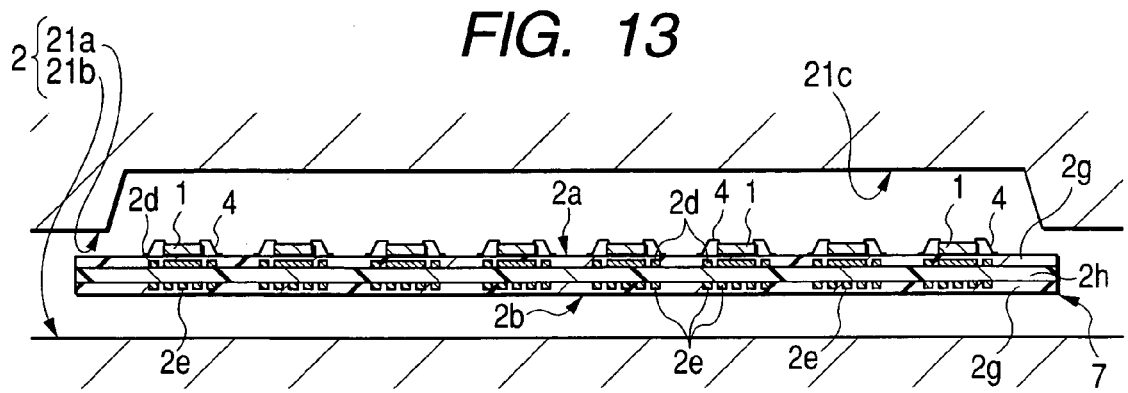
FIG. 13 is a partial cross-sectional diagram showing the substrate structure at block molding during the fabrication of semiconductor devices of this embodiment.
Figure 14:
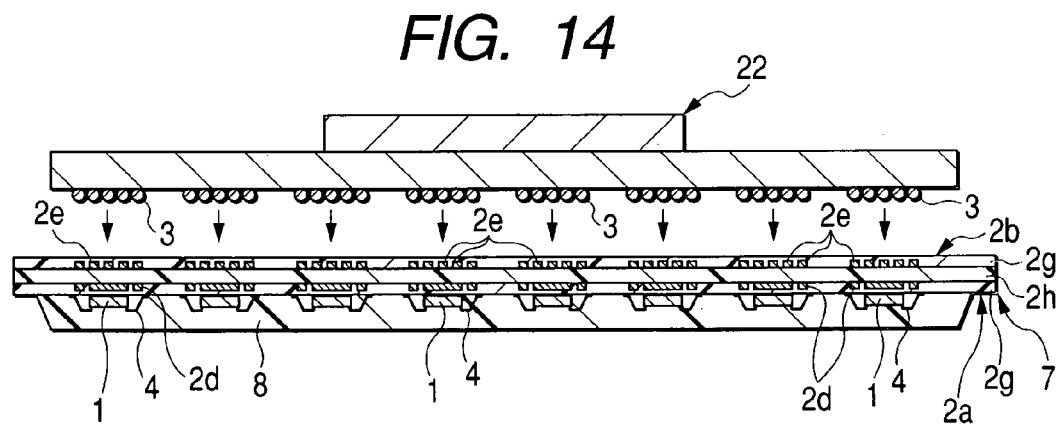
FIG. 14 is a cross-sectional diagram showing the substrate structure at ball mounting during the fabrication of semiconductor devices of this embodiment.
Figure 15:
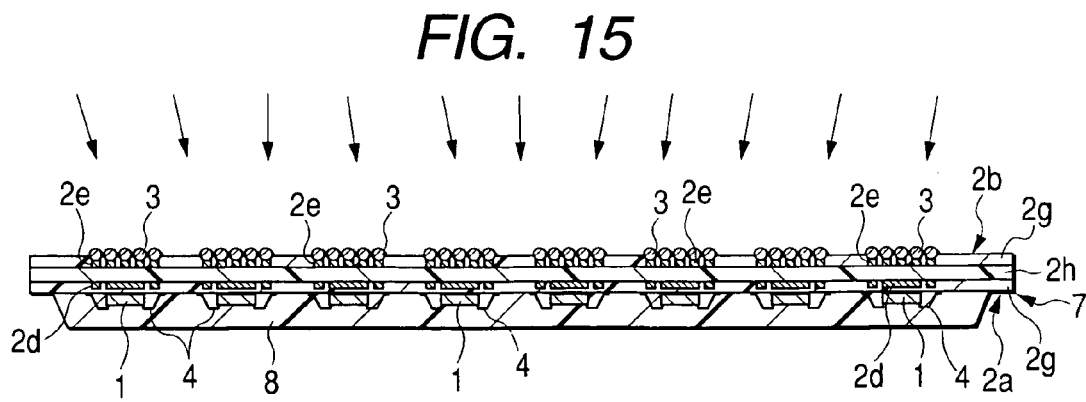
FIG. 15 is a cross-sectional diagram showing the substrate structure at ball cleaning during the fabrication of semiconductor devices of this embodiment.
Figure 16:
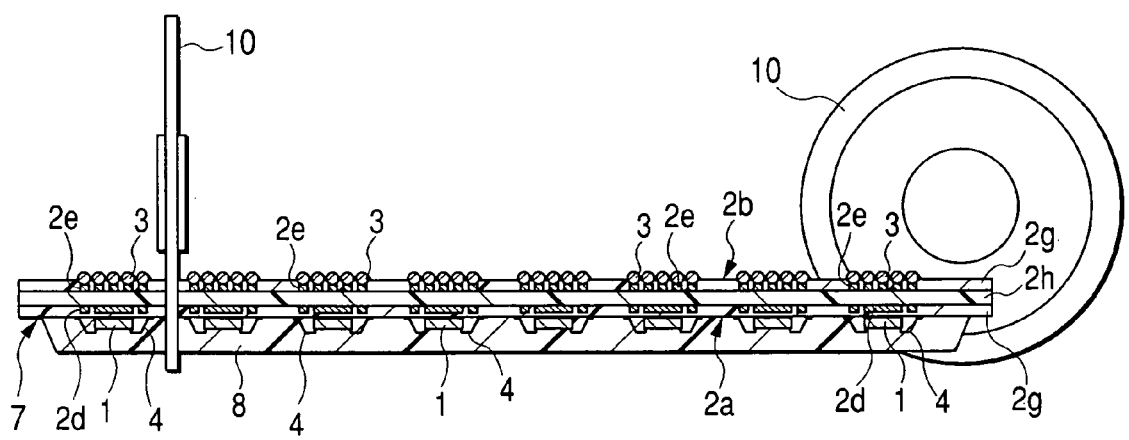
FIG. 16 is a cross-sectional diagram showing the substrate structure at dicing during the fabrication of semiconductor devices of this embodiment.
Figure 17:
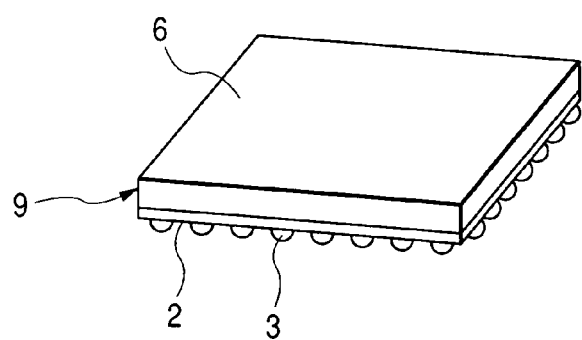
FIG. 17 is a perspective view showing the structure of a semiconductor device which has been isolated by the dicing process of the semiconductor device manufacturing method based on the first embodiment of this invention.
Figure 18:
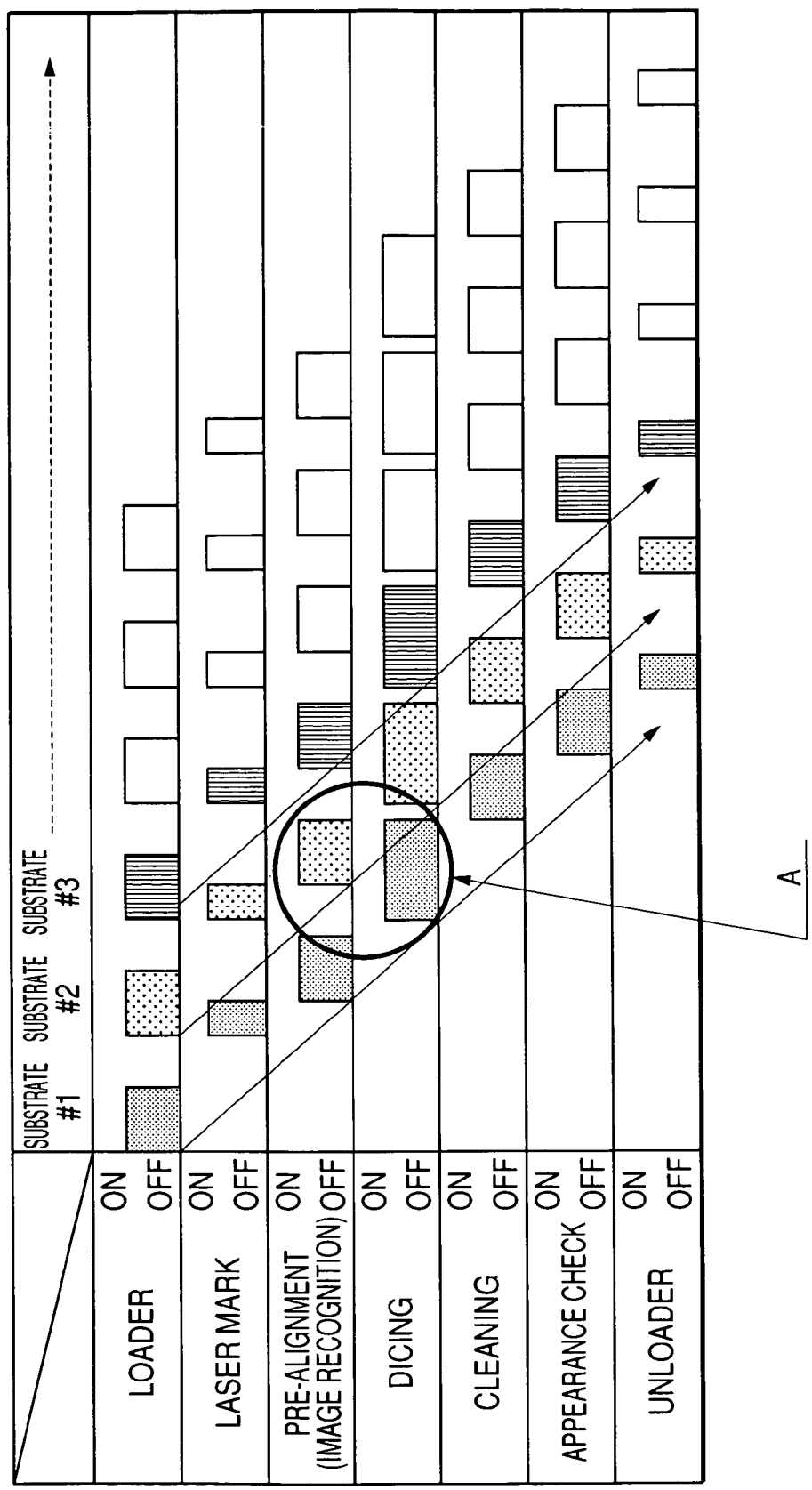
FIG. 18 is a timing chart showing the timings of processings of a combined apparatus which carries out the semiconductor device manufacturing method of the first embodiment of this invention.
Figure 19:
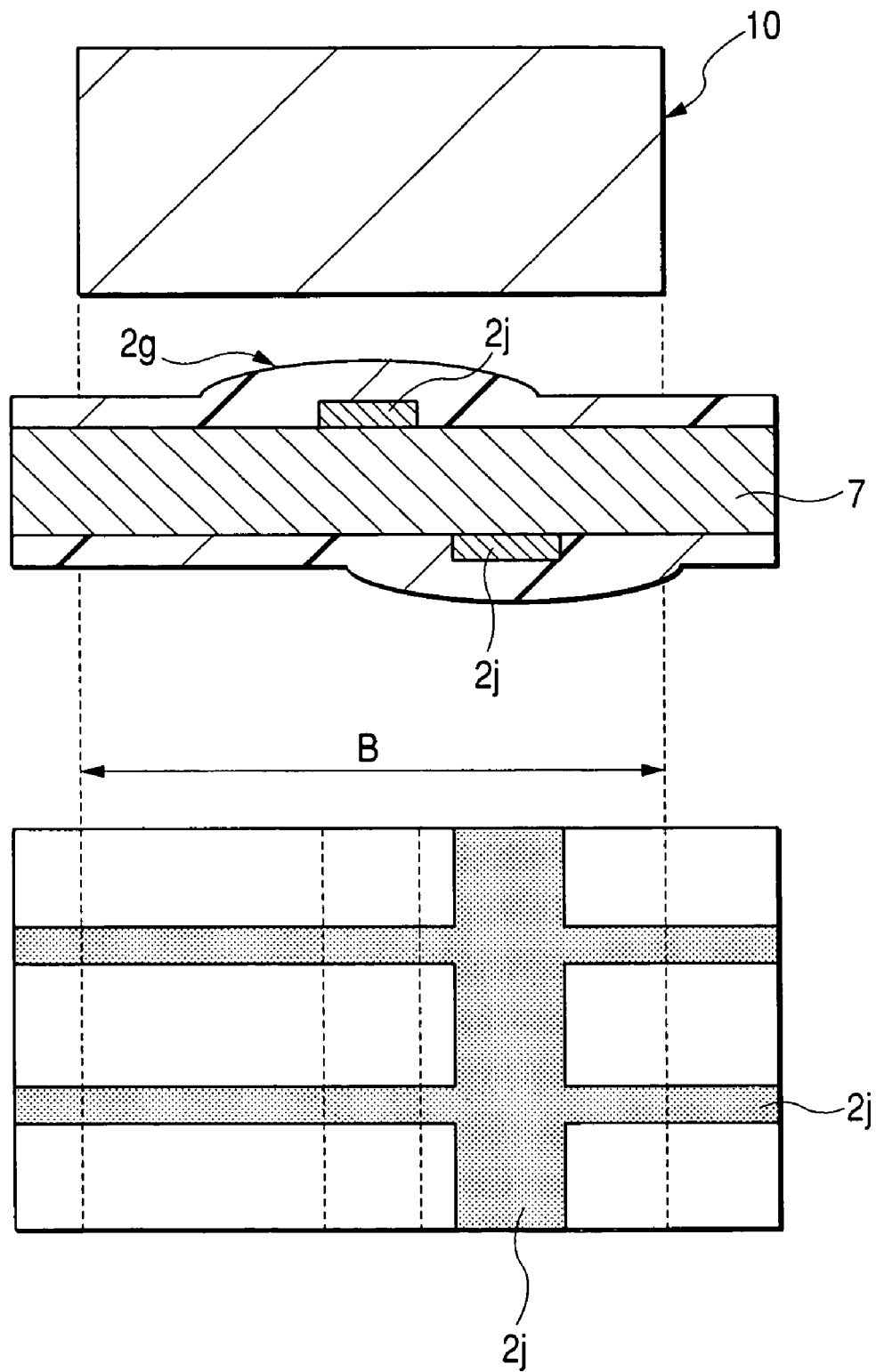
FIG. 19 is a set of a cross-sectional diagram and a rear surface wiring diagram, showing the positional relation between the blade width and the plating power feed wiring lines at the time of dicing based on this embodiment.
Figure 20:
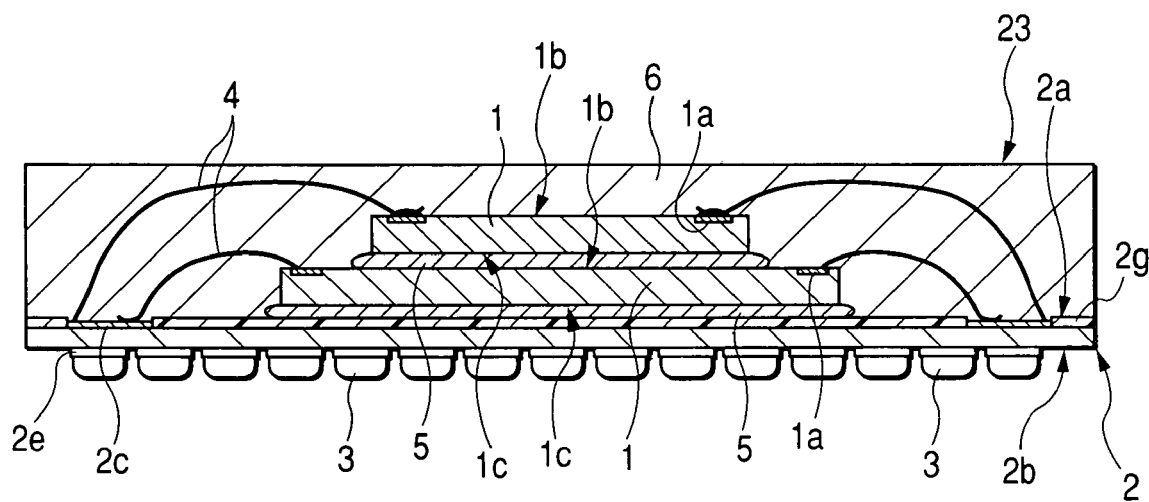
FIG. 20 is a cross-sectional diagram showing the structure of a semiconductor device based on a variant of the first embodiment.

FIG. 1 shows by plan view the structure of a semiconductor device manufacturing apparatus (combined apparatus) which carries out the semiconductor device manufacturing method based on a first embodiment of this invention; FIG. 2 shows by partial front view the structure of the principal portions of the semiconductor device manufacturing apparatus shown in FIG. 1; FIG. 3 shows by cross-sectional view the structure of the treatment tool used by the semiconductor device manufacturing apparatus shown in FIG. 1; FIG. 4 shows by plan view the structure of the chip mounting surface of the multi-arrayed substrate used by the semiconductor device manufacturing method of the first embodiment; FIG. 5 shows by plan view the structure of the packaging surface of the substrate shown in FIG. 4; FIG. 6 shows by enlarged plan view a conductor pattern in a device area of the chip mounting surface of the substrate shown in FIG. 4; FIG. 7 shows by enlarged plan view a conductor pattern in a device area of the packaging surface of the substrate shown in FIG. 5; FIG. 8 shows by plan view the structure of the chip mounting surface of a multi-arrayed substrate based on a variant of the first embodiment, FIG. 9 shows by plan view the structure of the packaging surface of the substrate shown in FIG. 8; FIG. 10 shows by cross-sectional view the substrate structure at the commencement of fabrication of semiconductor devices based on the first embodiment of this invention; FIG. 11 shows by cross-sectional view the substrate structure at die bonding during the fabrication of semiconductor devices based on this embodiment; FIG. 12 shows by cross-sectional view the substrate structure at wire bonding during the fabrication of semiconductor devices based on this embodiment; FIG. 13 shows by partial cross-sectional view the substrate structure at block molding during the fabrication of semiconductor devices of this embodiment; FIG. 14 shows by cross-sectional view the substrate structure at ball mounting during the fabrication of semiconductor devices of this embodiment; FIG. 15 shows by cross-sectional view the substrate structure at ball cleaning during the fabrication of semiconductor devices of this embodiment; FIG. 16 shows by cross-sectional view the substrate structure at dicing during the fabrication of semiconductor devices of this embodiment; FIG. 17 shows by perspective view the structure of a semiconductor device which has been isolated by the dicing process of the semiconductor device manufacturing method based on the first embodiment of this invention; FIG. 18 shows by timing chart the timings of processings of a combined apparatus which carries out the semiconductor device manufacturing method of the first embodiment of this invention; FIG. 19 shows by a set of cross-sectional view and rear surface wiring diagram the positional relation between the cutting blade width and the plating power feed wiring lines at the time of dicing based on this embodiment; and FIG. 20 shows by cross-sectional view the structure a semiconductor device based on a variant of the first embodiment.

A semiconductor device, which is fabricated based on the semiconductor device manufacturing method of the first embodiment, is called a ball grid array (BGA) 9, as shown in FIG. 17. The BGA 9 has many solder bumps 3 for external connection arrayed in multiple rows and in multiple columns on the rear surface 2b of a package substrate 2 (refer to FIG. 20), and it has a semiconductor chip 1 mounted on the main surface 2a of the package substrate 2.

The BGA 9 is fabricated on a multi-arrayed substrate 7 having multiple device areas (semiconductor device formation areas) 7a, as shown in FIG. 4; and, after resin-sealing, it is isolated by dicing.

Next, the dicing unit (semiconductor device manufacturing apparatus) 11 which carries out the semiconductor device manufacturing method of the first embodiment will be explained.

The dicing unit 11 shown in FIG. 1 is a combined apparatus made up of a pre-alignment section 11c serving as a first processing section and a dicing section 11e serving as a second processing section. Accordingly, it is capable of processing the image of substrate cutting positions of one substrate and dicing another substrate concurrently.

The dicing unit 11 includes a loader section 11a for feeding a multi-arrayed substrate 7; a laser marking section 11b for printing the product number and the like; a pre-alignment section 11c, serving as the first processing section and having a pre-alignment camera (imaging means) 11d, which is adapted to recognize dicing marks 7c (refer to FIG. 5) formed on the substrate 7; a dicing section 11e, serving as the second processing section, for dicing the substrate 7 with a cutting blade 10 in accordance with information resulting from image recognition by the pre-alignment section 11c; a cleaning section 11h for cleaning the diced product, an appearance checking section 11i for checking the appearance of the products; an unloader section 11j for delivering the checked products; and an xy table 11k, serving as the conveyance means, for carrying multi-arrayed substrates 7 through the pre-alignment section 11c, dicing section 11e and other processing sections.

The dicing section 11e is equipped with an alignment camera 11g and a dicing table 11f. Based on the recognition of only a few points (e.g., two points) by the alignment camera 11g, the substrate 7 on the table 11f can be diced with the cutting blade 10 which is located near the camera 11g.

Specifically, the pre-alignment section 11c implements the image processing to recognize all marks 7c on the multi-arrayed substrate 7, thereby determining in advance the dicing positions from the relative positional relation of the marks. The dicing section 11e completes the alignment of substrate 7 by recognizing only a few reference points with the alignment camera 11g and using the positional information of the marks 7c provided by the pre-alignment section 11c, and it can dice the substrate 7 swiftly with the cutting blade 10 located near the alignment camera 11g.

The dicing unit 11 of this embodiment uses a special treatment tool 12, as shown in FIG. 3, for carrying and processing the resin-sealed multi-arrayed substrate 7. Specifically, the substrate 7 is supported by the tool 12, since it is fed in by the loader section 11a until it reaches the unloader section 11j after undergoing several processings. Accordingly, the substrate 7 is treated for pre-alignment, dicing and conveyance in the dicing unit 11 while being continuously supported by the tool 12. The tool 12 is shaped like a plate, and it has a plurality of suction holes 12a in correspondence to the device areas 7a.

FIG. 3 shows the state of conveyance of the substrate 7 inside the dicing unit 11. The substrate 7 supported by the tool 12 is held by a hand section 12b through a porous member 12c above it, and it is carried in this state. At the time of dicing by the dicing section 11e, the hand section 12b and porous member 12c are removed, and a block molded section 8 is sucked up from the table 11f by air passing through the suction holes 12a of the tool 12 and is held on the table 11f.

Next, the multi-arrayed substrate 7 used in the semiconductor device manufacturing method of this embodiment will be explained.

FIG. 4 and FIG. 5 show the structure of the multi-arrayed substrate 7, with FIG. 4 showing the chip mounting surface of the substrate 7 and FIG. 5 showing the packaging surface (surface with solder bumps 3). The multi-arrayed substrate 7 of this embodiment is a multi-layer substrate having wiring layers formed on both sides.

The multi-arrayed substrate 7 has multiple device areas (semiconductor device formation areas) 7a formed in a matrix arrangement, as shown in FIGS. 4 and 5, and each device area 7a has a formation of conductor patterns on both sides.

Each device area 7a on the chip mounting side shown in FIG. 4 has a formation of conductor patterns, including power feed conductor patterns (plating wiring lines for power feed) 2j and dummy conductor patterns 2k, as shown in the enlarged diagram of FIG. 6, and these conductor patterns serve to enhance the rigidity of the substrate and the uniformity of the pattern density.

In addition, there are multiple conductor film removal areas 2i for the adjustment of the conductor pattern density. A bent hole 2f is formed at the middle of the device area 7a.

The power feed conductor patterns 2j, which are plating wiring lines, are required when electrolytic plating is applied to conductor patterns which transmit electrical signals. Conductor patterns undergo the electrolytic plating based on the power supply through the power feed conductor patterns 2j.

The power feed conductor patterns 2j are formed across the border of each device area 7a. Over the multi-arrayed substrate 7, power feed conductor patterns 2j of each device area 7a are connected together as wiring lines in the outer area of the adjacent device areas 7a.

On this account, the power feed conductor patterns 2j which are connected together in the outside of each device area 7a must be cut and isolated after power is supplied for electrolytic plating.

In the fabrication of the BGA 9, the power feed conductor patterns 2j are cut when the substrate 7 is diced to separate devices following the block molding, and the conductor patterns 2j are left in the insulated state in each device area 7a, as shown in FIG. 6.

In each device area 7a of the packaging surface shown in FIG. 5, there are several conductor patterns, including the power feed conductor patterns 2j for plating, dummy conductor patterns 2k, and bump lands 2e, as shown in enlarged view in FIG. 7, and these conductor patterns serve to enhance the rigidity of the substrate and the uniformity of the pattern density as in the case of the chip mounting surface. The bump lands 2e have through holes, and they are connected with solder bumps 3.

In this fashion, the multi-arrayed substrate 7 has a formation of power feed conductor patterns 2j for plating based on each of the multiple wiring layers (two layers on the chip mounting side and packaging side in this embodiment).

The multi-arrayed substrate 7 has, on the edges of the packaging surface, a formation of alignment marks 7c to be used at the time of dicing. These marks 7c are formed in pairs between the confronting edges at constant intervals in both the longitudinal and width directions so that lines which connect confronting marks become imaginary dicing lines 7b. That is, they are formed to the edge of the substrate. However, the dicing lines 7b are not formed to the multi-arrayed substrate 7.

At the time of dicing, after block molding, the pre-alignment section 11c of the dicing unit 11 recognizes the marks 7c formed along the edges of the substrate 7, and it finds the relative positional relation of the dicing lines 7b by connecting pairs of marks 7c based on the recognition result, thereby determining the running lines of the cutting blade 10. The cutting blade 10 is operated to run on the dicing lines 7b thereby to dice the substrate 7.

The marks 7c shown in FIG. 5 have the shape of an "H", which is oriented to be normal to each edge. The shape of marks 7c is arbitrary provided that it is recognizable by image recognition. The marks 7c are preferably part of a wiring conductor pattern so as to be formed simply together with the conductor patterns of wiring layers, at the same time and of the same material. Due to the formation of the marks 7c on the same layer as the conductor pattern, the marks 7c can be accurate in position with respect to conductor patterns, such as the power feed conductor patterns 2j.

In the semiconductor device fabrication of this embodiment, the cutting blade 10 dices the multi-arrayed substrate 7, which has undergone block molding, by cutting in from the packaging surface (rear surface 2b) of the substrate 7, as shown in FIG. 16. Accordingly, the marks 7c are required at least on the packaging surface of the substrate 7, and they can be absent on the chip mounting surface, as shown in FIG. 4. Otherwise, the marks 7c may be formed on both the chip mounting surface and packaging surface of the substrate 7, as shown by the variant embodiment of FIG. 8 and FIG. 9. By forming the marks 7c on the chip mounting surface of the substrate 7, as shown in FIG. 8, the die bonder 14 and wire bonder 15 shown in FIG. 21 can use the marks 7c for lead recognition by imaging the marks 7c easily from the chip mounting side.

The multi-arrayed substrate 7 has at its edges a formation of several through holes 7d to be used for positioning, as shown in FIG. 4, FIG. 5, FIG. 8, and FIG. 9.

Next, the semiconductor device (BGA 9) manufacturing method of this embodiment will be explained. This method basically uses a multi-arrayed substrate 7 on which multiple device areas 7a of the same size are formed in a matrix arrangement, implements block resin-molding to cover all device areas 7a, and dices the substrate 7 to separate individual BGAs 9.

Initially, a number of multi-arrayed substrates 7 are prepared, each having a resin section 2h of base material and a wiring section 2d of conductor patterns, having its portions, other than the exposed conductor patterns, covered with an insulation film 2g of solder resist, and having a formation of multiple device areas 7a, as shown in FIG. 10.

Thereafter, semiconductor chips 1 are mounted in the device areas 7a of the substrates 7, as shown in FIG. 11. Specifically, semiconductor chips 1, each having multiple pads 1a on its main surface 1b (refer to FIG. 20), are placed over the device areas 7a of the multi-arrayed substrate 7, and the chips 1 are joined on their rear surface 1c to die bond material 5 applied to the device areas 7a.

Subsequently, wire bonding is conducted, as shown in FIG. 12. Specifically, each semiconductor chip 1 has its pads 1a connected electrically by wire bonding to connection terminals 2c of a corresponding package substrate 2 of the multi-arrayed substrate 7 (refer to FIG. 20) with wires 4, such as gold wires.

The multi-arrayed substrate 7 undergoes resin-sealing using a resin formation mold 21 made up of an upper mold 21a and lower mold 21b, as shown in FIG. 13. The upper mold 21a (or lower mold 21b) has a cavity 21c which is large enough to cover all semiconductor chips 1 mounted in the device areas 7a of the multi-arrayed substrate 7.

The multi-arrayed substrate 7, with semiconductor chips 1 mounted in the individual device areas 7a, is set between the upper mold 21a and lower mold 21b of the resin formation mold 21 so that the multiple device areas 7a are covered by one cavity 21c, and the substrate 7 is clamped by the upper mold 21a and lower mold 21b. In this state, sealing resin is fed in to the cavity 21c to mold all the semiconductor chips 1 and wires 4 at once. The sealing resin is a heat curing epoxy resin for example.

Consequently, an block molded section 8 in which semiconductor chips 1 are covered in unitary fashion is formed, as shown in FIG. 14.

Subsequently, solder bumps 3 are mounted, as shown in FIG. 14. Specifically, the multi-arrayed substrate 7 is oriented to have the rear surface 2b of package substrates 2 facing upward, a ball mounting tool 22 which holds multiple solder bumps 3 by vacuum suction is brought above the substrate 7, and solder bump electrodes are formed on the bump lands 2e on the rear surface 2b of each package substrate 2 from above the substrate 7.

At this time, the solder bumps 3 are fitted by being fused based on the treatment of infrared reflow, for example. The fitting of solder bumps 3 may be conducted before dicing following the block molding, or it may be conducted after dicing. Subsequently, the solder bumps 3 are cleaned, as shown in FIG. 15. After that, the multi-arrayed substrate 7 is diced with the cutting blade 10 of the dicing unit 11 (refer to FIG. 1), as shown in FIG. 16. Specifically, the block molded section 8 sealed with resin and the substrate 7 are cut together to separate individual device areas 7a with the cutting blade 10.

The dicing process uses the dicing unit 11 shown in FIG. 1, in which the substrate 7 is treated in the order of loading, laser marking, pre-alignment (image recognition), dicing, cleaning, and appearance check, as shown in FIG. 18.

Initially, a first multi-arrayed substrate (substrate #1) 7 is carried from the loader section 11a to the laser marking section 11b to undergo the marking process. After the marking process, the first multi-arrayed substrate is carried to the pre-alignment section 11c to undergo image recognition of the marks 7c. Resulting data concerning the relative positional relation of the marks 7c is memorized. Concurrently with this process, a second multi-arrayed substrate (substrate #2) 7 is carried from the loader section 11a to the laser marking section 11b to undergo the marking process.

The pre-alignment section 11c, which is the first processing section, implements the image recognition of the first multi-arrayed substrate (substrate #1) 7. Specifically, the pre-alignment camera 11d images the packaging surface of the substrate 7 to recognize all marks 7c formed along the edges of the substrate packaging surface. The positional relation of the marks is calculated and memorized. Alternatively, all dicing lines 7b on which the cutting blade 10 runs are determined and memorized.

At the time of recognition of the marks 7c, the distances from the coordinates of marks 7c to a certain reference point are evaluated, or, alternatively, the distances between contiguous marks 7c are summed cumulatively.

Positional data of the marks 7c evaluated by the pre-alignment section 11c is memorized in such a state that the dicing section 11e can read the data out swiftly.

After that, the first multi-arrayed substrate 7 is carried from the pre-alignment section 11c to the dicing section 11e, which is the second processing section, by which the substrate serves as diced in accordance with the positional information of the marks 7c.

Specifically, the alignment camera 11g recognizes the position of the multi-arrayed substrate 7 accurately (e.g., it recognizes two marks 7c and accurately recognizes the position of the multi-arrayed substrate 7), and the substrate is diced in accordance with the positional information of the marks 7c.

Concurrently to the dicing of the first multi-arrayed substrate 7 by the pre-alignment section 11c, the second multi-arrayed substrate 7 (substrate #2) is carried from the laser marking section 11b to the pre-alignment section 11c to undergo the pre-alignment process. Virtually concurrently with this process, a third multi-arrayed substrate 7 is carried from the loader section 11a to the laser marking section 11b to undergo the marking process.

Accordingly, the dicing process for the first multi-arrayed substrate (substrate #1) 7, the pre-alignment process for the second multi-arrayed substrate (substrate #2) 7, and the marking process for the third multi-arrayed substrate 7 can take place concurrently, as indicated by A in FIG. 18.

Following these processings, the multi-arrayed substrates 7 are carried to the downstream processing sections to undergo cleaning and an appearance check sequentially, and, finally, they are carried to the unloader section 11j.

In the dicing operation for the multi-arrayed substrate 7 by the dicing section 11e, the cutting blade 10 is operated to cut in from the packaging surface (solder bump fitting surface) of the substrate 7.

Specifically, for a pair of marks 7c recognized by the pre-alignment section 11c, the cutting blade 10 is operated to run from one mark 7c to another mark 7c. This operation is repeated for all pairs of marks 7c, and the cutting blade 10 runs on all dicing lines shown in FIG. 5.

The dicing operation cuts the conductor patterns 2j of the plating power feed wiring lines. Specifically, the dicing operation cuts the power feed conductor patterns 2j formed on both sides of the multi-arrayed substrate 7, as shown in FIG. 19, causing the power feed conductor patterns 2j to be left in an insulated state in each device area 7a, as shown in FIG. 6.

The cutting blade 10 used for the dicing in accordance with this embodiment must have its width (B) large enough to cut, during the dicing operation, the power feed conductor patterns 2j that are formed on both sides of the multi-arrayed substrate 7.

By means of the dicing operation serving the cutting blade 10, the multi-arrayed substrate 7 and block molded section 8 are diced together into individual BGAs 9, each having a sealing member 6 formed on the package substrate 2, as shown in FIG. 17.

According to the dicing scheme of this embodiment, based on the provision of the pre-alignment section (first processing section) 11c having the pre-alignment camera (imaging means) 11d, which is adapted to recognize the marks 7c on the substrate 7, and the dicing section (second processing section) 11e for dicing the substrate 7 with the cutting blade 10 in accordance with the alignment information, the dicing unit 11 can operate for image recognition and dicing concurrently, whereby the throughput of dicing process can be improved. In consequence, the productivity of semiconductor device (BGA 9) can be improved.

Based on the image processing to recognize the positions of all marks 7c, the dicing accuracy can be improved.

Next, the semiconductor device shown in FIG. 20, which is a variant of the first embodiment, will be explained. This semiconductor device is a chip-stacked BGA 23 having semiconductor chips stacked in multiple stages (e.g., two stages).

Semiconductor devices of this type have an increased number of signal pins, causing the multi-arrayed substrate 7 to have as many as four or five wiring layers. An increased number of wiring layers is likely to result in a larger disparity of wiring line width and position, giving rise to the occurrence of a short-circuit between wiring lines after the substrate is diced, unless the dicing positioning accuracy is enhanced.

In this respect, the dicing scheme of this embodiment can enhance the dicing accuracy, and it is capable of preventing the occurrence of a short-circuit between wiring lines even for the fabrication of a semiconductor device with a package substrate (multi-arrayed substrate) 2 having many wiring layers, as shown in FIG. 20.

Embodiment 2

Figure 21:
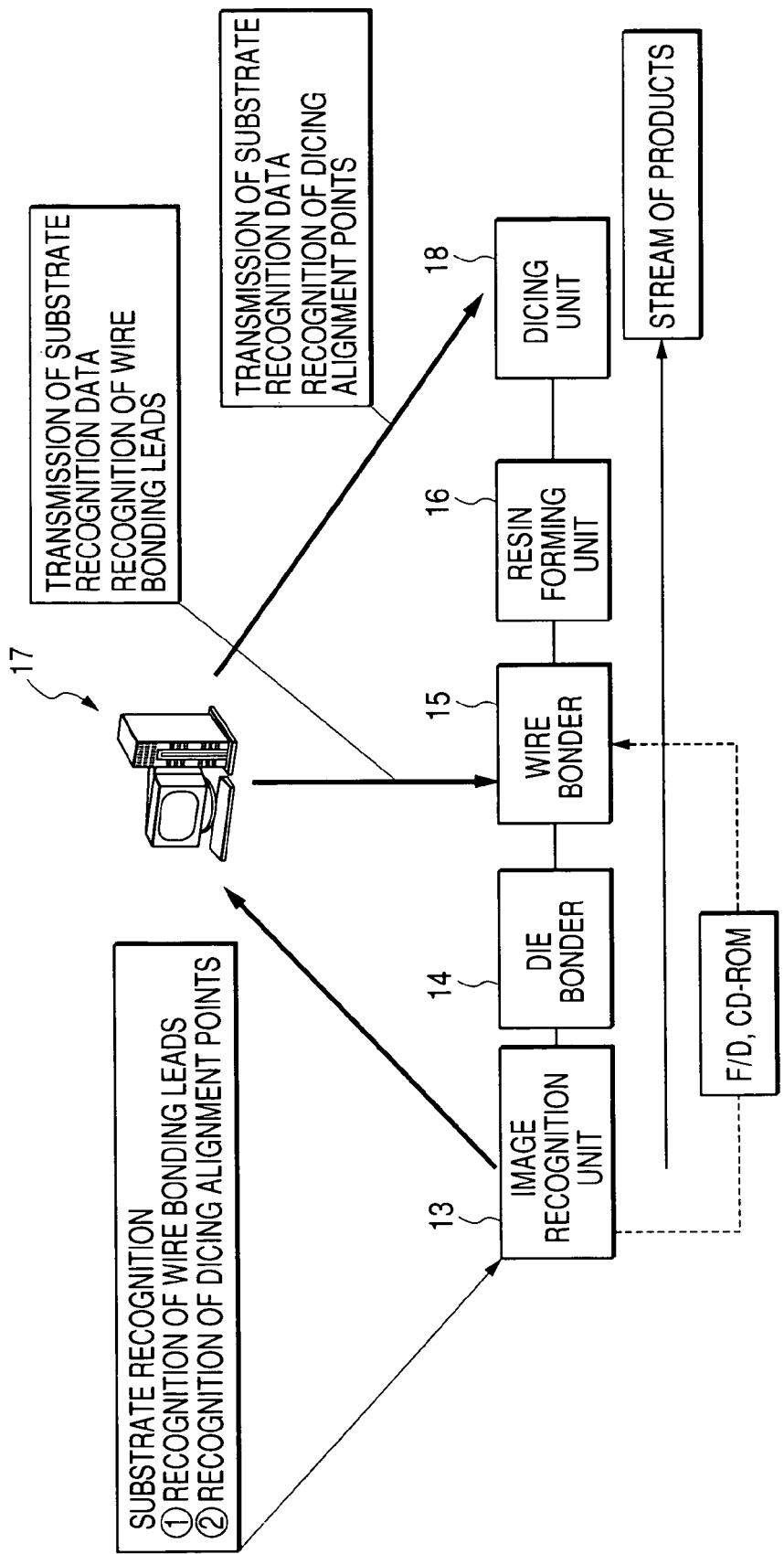
FIG. 21 is a block diagram showing the structure of a semiconductor device manufacturing system (separate apparatus) which carries out the semiconductor device manufacturing method based on a second embodiment of this invention.
Figure 22:
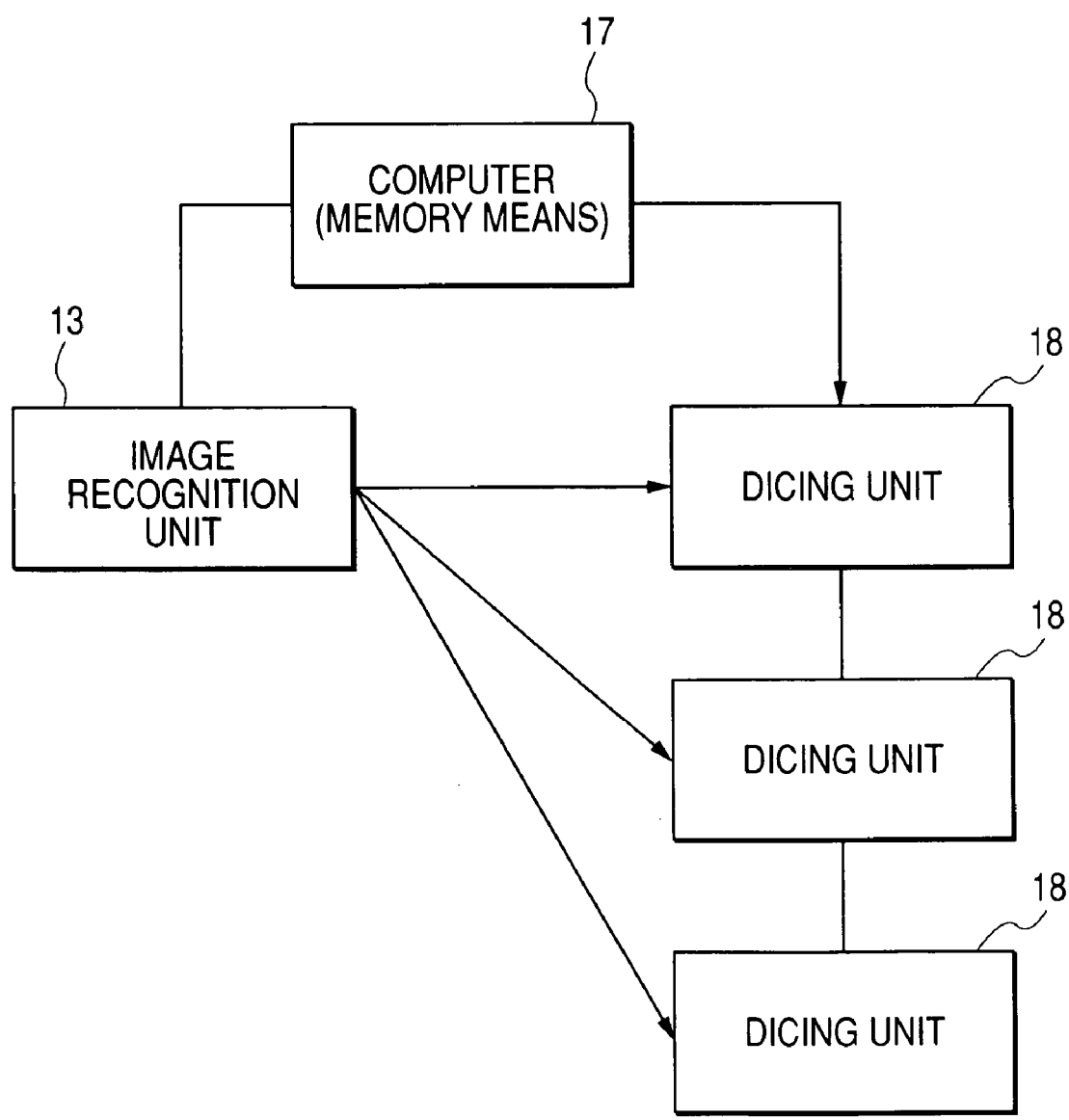
FIG. 22 is a block diagram showing the arrangement of the semiconductor device manufacturing system based on a variant of the second embodiment.

FIG. 21 shows by block diagram the configuration of a semiconductor device manufacturing system (separate units) used by the semiconductor device manufacturing method based on a second embodiment of this invention, and FIG. 22 shows by block diagram the configuration of a semiconductor device manufacturing system which is a variant of the system of FIG. 21.

The system used by the method of this embodiment includes a dicing unit 18 and image recognition unit 13 that are provided separately, in contrast to the first embodiment in which the dicing unit 11 incorporates the pre-alignment section 11c and dicing section 11e.

Specifically, the semiconductor device manufacturing system shown in FIG. 21 includes an image recognition unit 13 which recognizes marks 7c formed on the multi-arrayed substrate 7 (refer to FIG. 5), a computer 17 which operates as a memory means for memorizing information resulting from image recognition by the image recognition unit 13 or information calculated from the recognition result, a die bonder 14 for die bonding, a wire bonder 15 for wire bonding, a resin molding unit 16 for resin molding, and a dicing unit 18 for dicing the substrate which has undergone resin formation.

The semiconductor device manufacturing method of this embodiment is designed to recognize in advance the dicing lines of the multi-arrayed substrate 7 based on marks 7c by using the image recognition unit 13 in a separate process carried out earlier than the dicing process, which is preceded by resin-sealing, so that the dicing process solely implements dicing, thereby to improve the throughput of dicing. Furthermore, the image recognition unit 13 also recognizes in advance the lead wire bonding points so as to be used for the wire bonding process. The resulting reduction of alignment time in each process enables improvement in the throughput of the semiconductor device production.

For example, the semiconductor device manufacturing system of FIG. 21 operates, at the time of substrate recognition with the image recognition unit 13, to recognize the wire bonding lead lines and also to recognize the alignment points for dicing based on the marks 7c.

The image recognition unit 13 can also recognize in advance the identification code (e.g., bar code) of a substrate so that lead line data and mark data, which have been memorized in the memory means, i.e., the computer, in correspondence to the identification code of individual substrates can be read out easily and swiftly.

After that, the die bonder 14 is operated to mount semiconductor chips on the multi-arrayed substrates 7.

Subsequently, the wire bonder 15 is operated for wire bonding. Specifically, the identification code of the multi-arrayed substrate 7 is recognized, positional information (data) concerning lead lines for wire bonding relevant to the identification code is fetched from the computer, and the positional information is sent to the wire bonder 15. The wire bonder 15 merely implements the alignment of the lead lines which serve for the reference points of the substrate 7, and it implements the wire bonding on the substrate 7 in accordance with the positional information sent from the computer 17.

Subsequently, the resin formation unit 16 is operated to implement resin-sealing.

After resin-sealing, the dicing unit 18 is operated to dice the substrate 7. Specifically, the dicing unit 18 recognizes the identification code of the substrate 7. Positional information (data) concerning the marks 7c for dicing corresponding to the identification code is read out of the computer 17, and it is sent to the dicing unit 18.

The dicing unit 18 merely implements the alignment of the marks 7 which serve establish or the reference points of the substrate 7, and it implements the dicing of the substrate 7 in accordance with the dicing positional information sent from the computer 17.

Accordingly, based on the prior recognition of lead line positions and mark positions with the image recognition unit 13, the time expended for the wire bonding process and dicing process can be reduced, whereby the throughput of these processes can be improved. In consequence, the productivity of semiconductor device can be improved.

By recognizing the positions of all marks 7c based on the image processing with the image recognition unit 13, the dicing accuracy can be improved, as in the case of the first embodiment.

The semiconductor device manufacturing system of FIG. 21 may be designed to implement, using the image recognition unit 13, the recognition of the positions of die bonding marks which have been formed in advance on the multi-arrayed substrate 7 and implement the die bonding with the die bonder 14 in accordance with the positional information at the time of the die bonding process.

The memory means for memorizing the positional information provided by the image recognition unit 13 or positional information calculated from the recognition result is not confined to the computer 17, but the information may be stored in a floppy disk unit or CD-ROM (compact disk read-only memory) unit. In this case, the floppy disk or CD-ROM having a record of positional information is brought to the intended semiconductor device fabrication unit, such as the wire bonder 15 or dicing unit 18, by which data in need is read out for processing.

The die bonding position marks must be present on the chip mounting side of the multi-arrayed substrate 7. One scheme is to form position marks 7c on both sides of the substrate 7. The image recognition unit 13 recognizes all marks 7c on one side, and thereafter, with the substrate 7 being turned upside down, it recognizes all marks 7c on the other side, thereby recognizing all marks 7c on both sides. Another scheme is to equip pre-alignment cameras 11d (refer to FIG. 1) on both sides of the multi-arrayed substrate 7 and recognize the marks 7c on both sides of the substrate 7 with these cameras 11d.

The semiconductor device manufacturing method of this embodiment may be designed to recognize in advance the die bonding position marks 7c of multi-arrayed substrates 7 by another facility outside of the semiconductor device manufacturing system. After the preparatory operation for carrying in a multi-arrayed substrate 7 and positional information (data) of the marks 7c, the die bonding process, wire bonding process, resin formation process, and dicing process are conducted to fabricate semiconductor devices.

Next, the semiconductor device manufacturing system based on a second variant of the embodiment, as shown in FIG. 22, will be explained. In the semiconductor device manufacturing system shown in FIG. 21, when the image recognition unit 13 operates significantly faster than the dicing unit 18 (e.g., faster by three times), three dicing units 18 are connected to one image recognition unit 13, as shown in FIG. 22, so that the image recognition process and the dicing process are improved much in turn around time. In consequence, the dicing process has improved throughput, and the image recognition unit 13 can fully exert its ability.

While the present invention has been described in connection with specific embodiments, the invention is not confined to these embodiments, but various alterations are obviously possible without departing from the essence of the invention.

For example, resin molding may be implemented by covering the device areas 7a with individual cavities 21c of the resin formation mold 21 and feeding resin into the separate cavities, instead of implementing the block molding which is adopted by the first embodiment.

Electrical connection between the semiconductor chip 1 and the multi-arrayed substrate 7 may be based on flip-chip connection, instead of wire connection which is adopted by the first embodiment.

Semiconductor devices, which are BGAs 9 or chip-stacked BGAs 23 in the first embodiment, may be of another type, such as LGAs (land grid arrays), provided that they are fabricated on a multi-arrayed substrate 7 and separated by dicing after resin-sealing.

Among the features of the present invention disclosed in this specification, the major effectiveness thereof is briefly stated as follows.

Based on the provision of a first processing section having imaging means which is adapted to recognize marks on a multi-arrayed substrate and a second processing section which dices the substrate with a cutting blade in accordance with positional information resulting from the alignment process by the first processing section, it becomes possible to implement the alignment and dicing concurrently, whereby the throughput of dicing process in semiconductor device fabrication can be improved.

The invention claimed is:

1. A method of manufacturing a semiconductor device by using a multi-arrayed substrate having a plurality of semiconductor device formation areas, said method comprising the steps of:
 (a) preparing a plurality of multi-arrayed substrates;
 (b) mounting a plurality of semiconductor chips over the multi-arrayed substrates respectively;
 (c) resin-sealing the semiconductor chips which have been mounted over the multi-arrayed substrates;
 (d) placing a first multi-arrayed substrate out of the multi-arrayed substrates in a first processing section;
 (e) implementing the image recognition for the first multi-arrayed substrate out of the multi-arrayed substrates by using a first alignment camera in the first processing section;

(f) conveying the first multi-arrayed substrate from the first processing section to a second processing section, and, placing a second multi-arrayed substrate out of the multi-arrayed substrates in the first processing section; and (g) dicing the first multi-arrayed substrate into individual semiconductor devices in the second processing section, and, at the same time, implementing the image recognition for the second multi-arrayed substrate in the first processing section.

2. A semiconductor device manufacturing method according to claim 1, wherein said image recognition step recognizes a plurality of marks formed along the edges of each multi-arrayed substrate, determines running lines of a cutting blade based on pairs of confronting marks recognized, and operates said cutting blade to run on the determined running lines thereby to dice the substrate.

3. A semiconductor device manufacturing method according to claim 1, wherein said multi-arrayed substrate comprises a multi-layer substrate having a plurality of wiring layers.

4. A semiconductor device manufacturing method according to claim 1, wherein said multi-arrayed substrate has a formation of plating power feed lines, said plating power feed lines being cut by dicing.

5. A semiconductor device manufacturing method according to claim 1, wherein said marks to be recognized at said image recognition are formed of a conductor pattern.

6. A semiconductor device manufacturing method according to claim 1, wherein said multi-arrayed substrate comprises a multi-layer substrate having a plurality of wiring layers, with each wiring layer having a formation of plating power feed lines.

7. A semiconductor device manufacturing method according to claim 1, wherein before the dicing step, implementing the image recognition for the first multi-arrayed substrate by using a second alignment camera in the second processing section.

8. A semiconductor device manufacturing method according to claim 7, wherein recognized points by using the second alignment camera are fewer than that by using the first alignment camera.

9. A semiconductor device manufacturing method according to claim 7, wherein recognized points by using the second alignment camera are two points.

10. A semiconductor device manufacturing method according to claim 1, wherein said image recognition step recognizes a plurality of marks of each multi-arrayed substrate, and wherein in the second processing section only a few of said plurality of marks are recognized for alignment in the second processing section.

11. A semiconductor device manufacturing method according to claim 1, further comprising a marking process for a third multi-arrayed substrate of said plurality of multi-arrayed substrates; and wherein the marking process for the third multi-arrayed substrate takes place concurrently with the dicing of the first multi-arrayed substrate in the second processing section and implementing the image recognition for the second multi-arrayed substrate in the first processing section.

12. A semiconductor device manufacturing method according to claim 1, wherein the semiconductor device manufactured is a ball grid array device.

13. A method of manufacturing a semiconductor device by using a multi-arrayed substrate having a plurality of semiconductor device formation areas, said method comprising the steps of:

(a) preparing a plurality of multi-arrayed substrates, with each substrate formed with semiconductor device formation areas;

(b) mounting a plurality of semiconductor chips over the plurality of the semiconductor device formation areas respectively;

(c) connecting electrically between the semiconductor chips and the multi-arrayed substrates;

(d) sealing the overall semiconductor device formation areas of the multi-arrayed substrate by means of a cavity of a resin formation mold and feeding sealing resin into the cavity thereby to resin-seal the semiconductor chips;

(e) implementing the image recognition for a first multi-arrayed substrate out of the multi-arrayed substrates; and (f) dicing, after the step (e), the overall resin-sealed portion of the first multi-arrayed substrate into individual semiconductor devices, and, at the same time, implementing the image recognition for a second multi-arrayed substrate out of the multi-arrayed substrates.

14. A semiconductor device manufacturing method according to claim 13, including the steps of:

placing the first multi-arrayed substrate out of the multi-arrayed substrates in a first processing section to implement the image recognition, and thereafter moving the first multi-arrayed substrate to place in a second processing section and placing a second multi-arrayed substrate in said first processing section; and dicing the block molded portion of the first multi-arrayed substrate and the first multi-arrayed substrate together into individual semiconductor devices in said second processing section and, at the same time, implementing the image recognition for the second multi-arrayed substrate in said first processing section.

15. A semiconductor device manufacturing method according to claim 13, wherein said semiconductor chip mounting step (b) stacks the semiconductor chips in multiple stages.

16. A semiconductor device manufacturing method according to claim 13, wherein the step (e) recognizes a plurality of marks formed along the edges of each multi-arrayed substrate, determines running lines of a cutting blade based on pairs of confronting marks recognized, and operates said cutting blade to run on the determined running lines during the dicing, thereby to dice the substrate.

17. A semiconductor device manufacturing method according to claim 13, wherein the semiconductor device manufactured is a ball grid array device.

* * * * *